United States Patent
Lin et al.

(10) Patent No.: US 7,851,310 B2
(45) Date of Patent: Dec. 14, 2010

(54) METHOD FOR FORMING SEMICONDUCTOR DEVICE

(75) Inventors: Li-Cheng Lin, Taipei (TW); Wei-Chieh Lin, Hsinchu (TW)

(73) Assignee: Anpec Electronics Corporation, Hsinchu Science Park, Hsin-Chu (TW)

( * ) Notice: Subject to any disclaimer, the term of this patent is extended or adjusted under 35 U.S.C. 154(b) by 83 days.

(21) Appl. No.: 12/483,237

(22) Filed: Jun. 11, 2009

(65) Prior Publication Data

US 2010/0216290 A1    Aug. 26, 2010

(30) Foreign Application Priority Data

Feb. 20, 2009   (TW) .............................. 98105435 A

(51) Int. Cl.
*H01L 21/338* (2006.01)

(52) U.S. Cl. .................... 438/270; 257/267; 257/471; 257/E21.41

(58) Field of Classification Search ................. 438/470; 257/267, 471, E21.41
See application file for complete search history.

(56) References Cited

U.S. PATENT DOCUMENTS

| 2010/0176448 A1* | 7/2010 | Hsieh | ........................ 257/334 |
| 2010/0237414 A1* | 9/2010 | Hsieh | ........................ 257/337 |

* cited by examiner

*Primary Examiner*—Matthew S Smith
*Assistant Examiner*—Christine Enad
(74) *Attorney, Agent, or Firm*—Winston Hsu; Scott Margo

(57) ABSTRACT

A method for forming semiconductor device, which simultaneously forms a trench MOS transistor device, and an embedded schottky barrier diode (SBD) device in a semiconductor substrate. The embedded SBD device has lower forward voltage drop, which reduces power dissipation. In addition, the voltage bearing ability may be modified easily by virtue of altering the dopant concentration or the width of the voltage bearing dopant region, or the thickness of epitaxial silicon layer. Furthermore, extra cost of purchasing SBD diode may be saved.

8 Claims, 14 Drawing Sheets

METHOD FOR FORMING SEMICONDUCTOR DEVICE

BACKGROUND OF THE INVENTION

1. Field of the Invention

The present invention is related to a method for forming an embedded schottky barrier diode (SBD) device, and particularly, to a method for forming an integrated circuit having a trench MOS transistor and an embedded SBD device.

2. Description of the Prior Art

SBD devices are constructed from the contact between a metal and a semiconductor. They have lower threshold voltage than p-n junction diodes and short reacting time which provides their use in power converters. The MOS transistor device of the conventional power converter, such as a buck circuits, is electrically connected to an external SBD device, which has a higher production cost and therefore increases the cost of the conventional power converter.

SUMMARY OF THE INVENTION

The present invention provides a method of forming a semiconductor device in order to solve the problems of the conventional method.

According to the claimed invention, the present invention provides a method of forming a semiconductor device, comprising:

providing a semiconductor substrate, the semiconductor substrate comprising a gate electrode conducting region, a trench MOS transistor device region, and an embedded SBD device region defined thereon, the semiconductor substrate having a first dopant type;

forming an insulating layer on a top surface of the semiconductor substrate in the gate electrode conducting region;

forming at least a trench in the trench MOS transistor device region of the semiconductor substrate;

forming a dielectric thin film on the top surface of the semiconductor substrate and an inner wall of the trench;

forming a doped semiconductor layer on the insulating layer and the dielectric thin film, and filling the trench with the doped semiconductor layer;

removing a portion of the doped semiconductor layer and forming a gate electrode in the trench and a gate linking line in the gate electrode conducting region, the gate linking line being electrically connected to the gate electrode;

performing a doping process upon the embedded SBD device region of the semiconductor substrate out of the trench to form a doped body, the doped body having a second dopant type;

forming a patterned mask on the doped body and the patterned mask partially covering the doped body, and performing another doping process upon the exposed doped body to form two source regions in the doped body, the source regions having the first dopant type;

removing the patterned mask;

forming a dielectric layer on the semiconductor substrate, the dielectric layer having a source opening to expose the doped body between the source regions;

forming a source contact in the trench MOS transistor device region between the source regions and forming at least a voltage bearing dopant region in the embedded SBD device region of the semiconductor substrate, the voltage bearing dopant region having the second dopant type; and forming a gate line in the gate electrode conducting region and forming a source electrode in the trench MOS transistor device region and the embedded SBD device region, the gate line being electrically connected to the gate linking line in the gate electrode conducting region, the source electrode being electrically connected to the source contact in the trench MOS transistor device region and the semiconductor substrate in the embedded SBD device region.

The method of the present invention is performed to simultaneously form a trench MOS transistor device and an embedded SBD device in the semiconductor substrate. The embedded SBD device has lower resistance which and low forward voltage drop which reduces power dissipation. In addition, the voltage bearing ability may be modified easily by virtue of altering the dopant concentration or the width of the voltage bearing region, or the thickness of the epitaxial silicon layer. Furthermore, extra cost of purchasing SBD diode may be saved.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
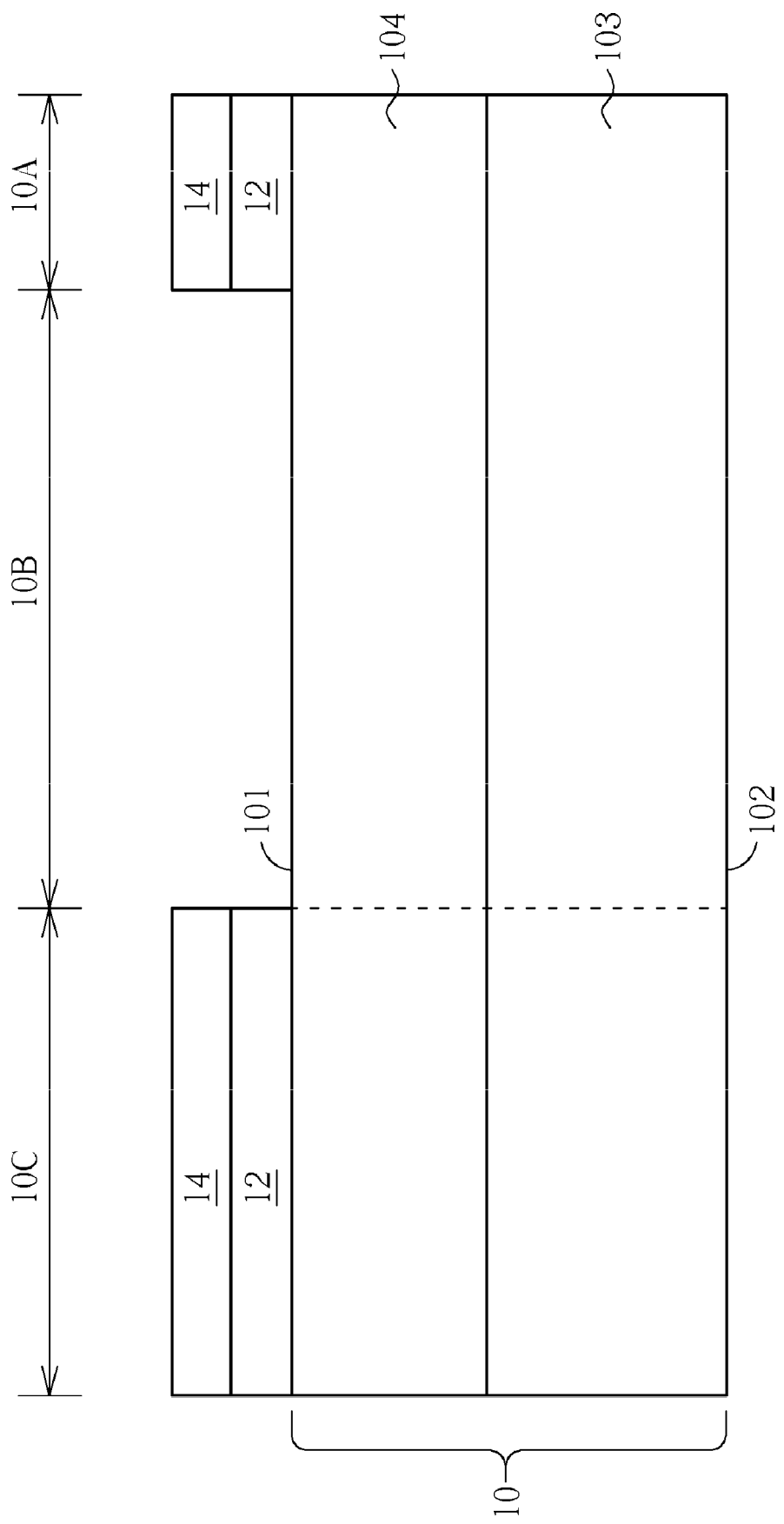
FIGS. 1-13 are schematic diagrams illustrating a method of forming a semiconductor device according to a preferred embodiment of the present invention.

Please refer to FIGS. 1-13, which are schematic diagrams illustrating a method of forming a semiconductor device according to a preferred embodiment of the present invention. As shown in FIG. 1, a semiconductor substrate 10 is provided. The semiconductor substrate 10 includes a top surface 101 and a bottom surface 102. A gate electrode conducting region 10A, a trench MOS transistor device region 10B, and an embedded SBD device region 10C are defined on the semiconductor substrate 10. In the present embodiment, the semiconductor substrate 10 includes a silicon substrate 103 and an epitaxial silicon layer 104 on the silicon substrate 103. The thickness of the epitaxial silicon layer 104 in the embedded SBD device region 10C may be modified depending on the requirement for voltage bearing ability to determine the voltage bearing ability of an embedded SBD device to be formed. Basically, the more the thickness of the epitaxial silicon layer 104 is, the better voltage bearing ability it has. However, the thickness of the epitaxial silicon layer 104 also affects the properties of the SBD device. As a result, the thickness of the epitaxial silicon layer 104 may be modified depending on the requirements for voltage bearing ability and the properties of the SBD device. The material of the semiconductor substrate 10 is not limited to the silicon substrate disclosed above, and the semiconductor substrate 10 may be a single-layered structure or a multi-layered structure made of other suitable semiconductor materials. In addition, both of the silicon substrate 103 and the epitaxial silicon layer 104 have a first dopant type, such as N type. The silicon substrate 103 is heavily doped and has a higher dopant concentration than that of the epitaxial silicon layer 104. An insulating layer 12 is formed on the top surface 101 of the semiconductor substrate 10, and a patterned mask 14 is formed on the insulating layer 12, such as a patterned photoresist, by means of using a first mask together with a lithography process. The insulating layer 12 exposed by the patterned mask 14 is etched to expose the semiconductor substrate 10 in the trench MOS transistor device region 10B. The insulating layer 12 disposed on the gate electrode conducting region 10A and the embedded SBD device region 10C is preserved. In the present embodiment, the insulating layer 12 may be a silicon oxide layer formed by a deposition process or a thermal oxidation process, and the material and the method for forming the insulating layer are not limited. The insulating layer 12 is used for insulating the semiconductor substrate 10 from a gate linking line to be formed and for protecting the embedded SBD device region 10C of the semiconductor substrate 10 from damaging in the following process.

Figure 2:
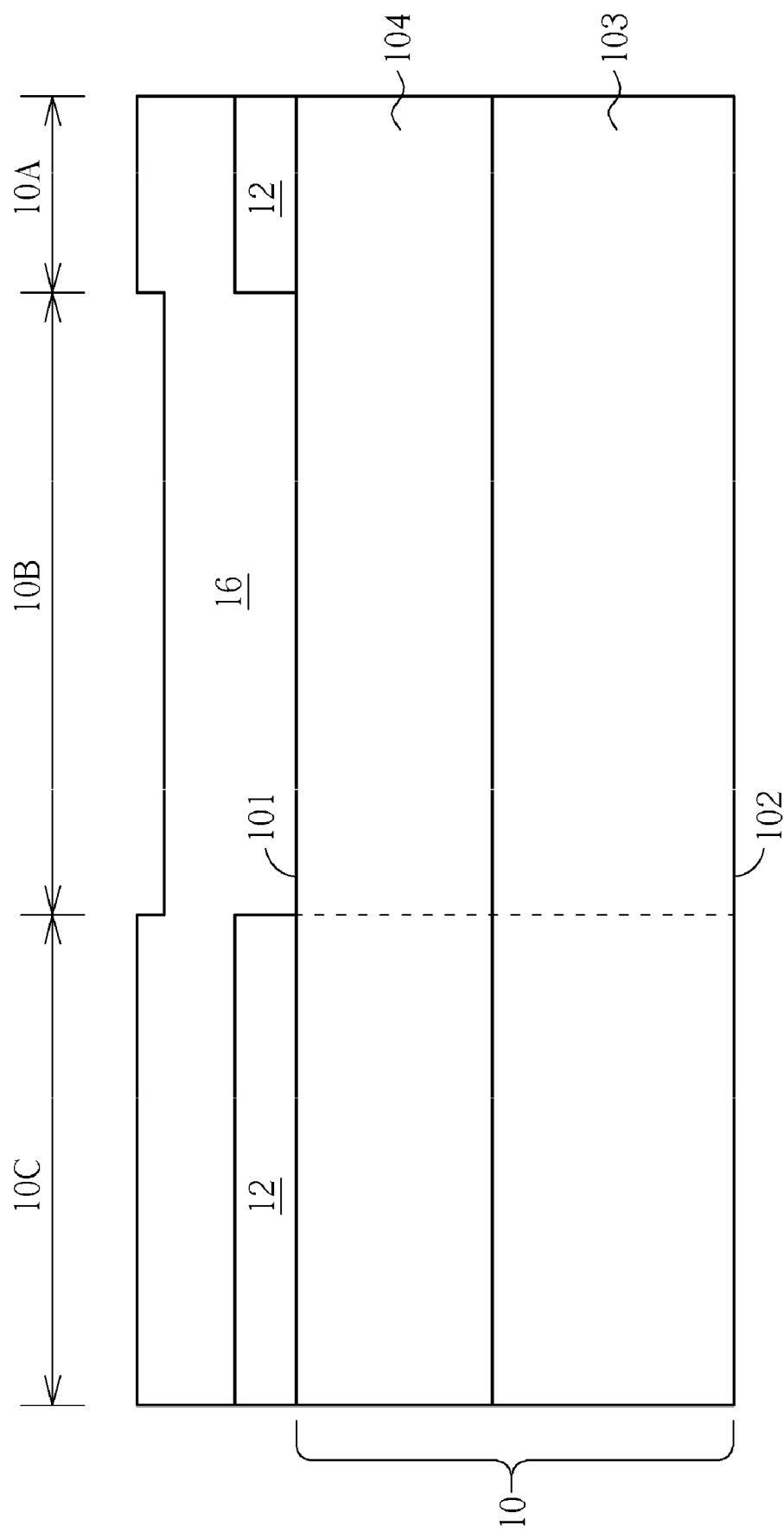

As shown in FIG. 2, the patterned mask 14 is removed, and a sacrificial layer 16 is optionally formed on the top surface 101 of the semiconductor substrate 10 and the insulating layer 12. The sacrificial layer may be a silicon oxide layer formed by a CVD process. Another patterned mask 18, such as a patterned photoresist, is formed on the sacrificial layer 16 by means of using a second mask in company with a lithography process. The gate electrode conducting region 10A and the embedded SBD device region 10C are covered by the patterned mask 18, and a portion of the sacrificial layer 16 disposed in the trench MOS transistor device region 10B is exposed. The patterned mask 18 is used to determine the position of posteriorly formed trenches. The sacrificial layer 16 is used to prevent the patterned mask 18 from damage during the etching process of forming the trenches which results in lowering the accuracy of the pattern of the trenches.

Figure 3:
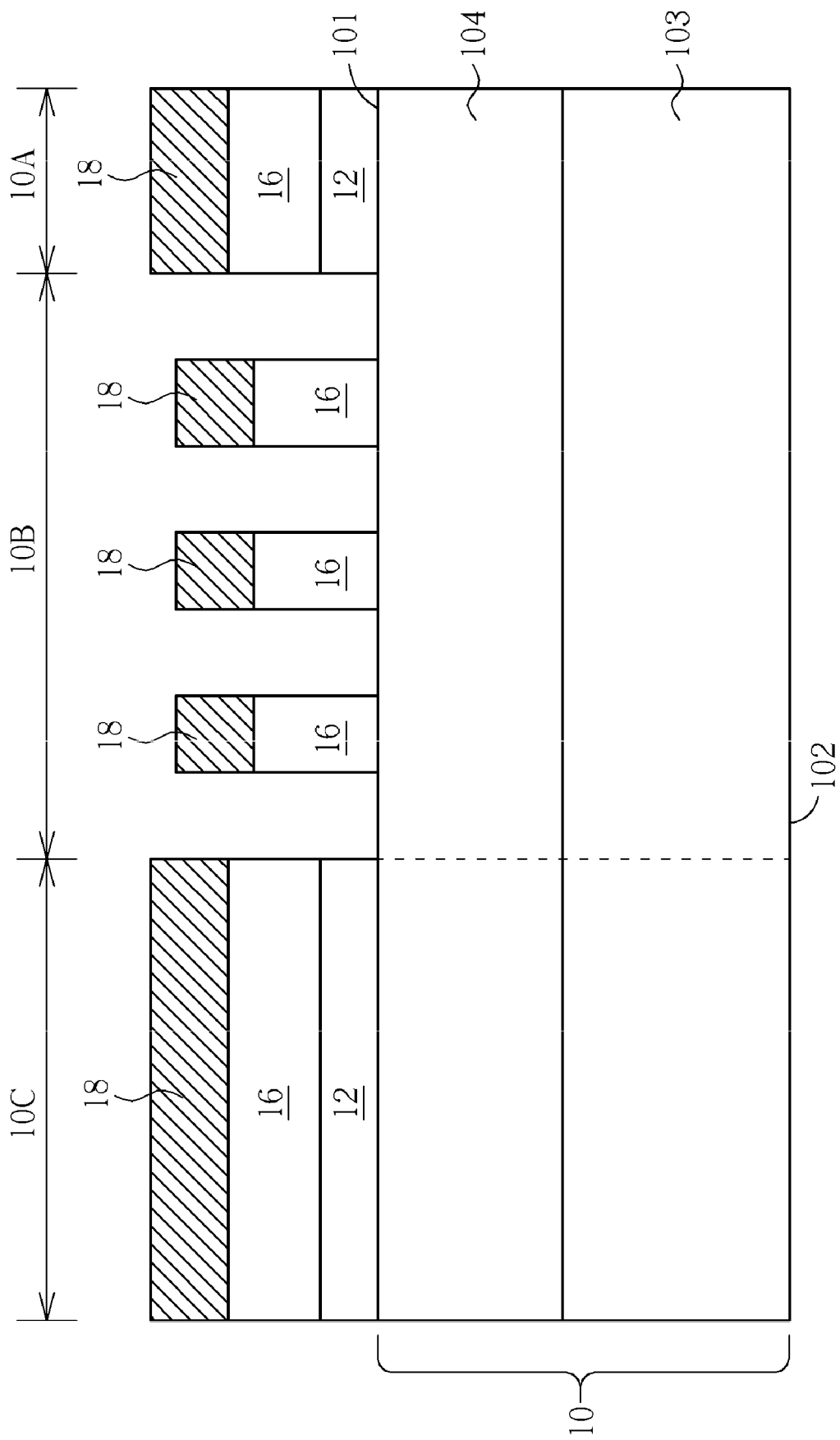
Figure 4:
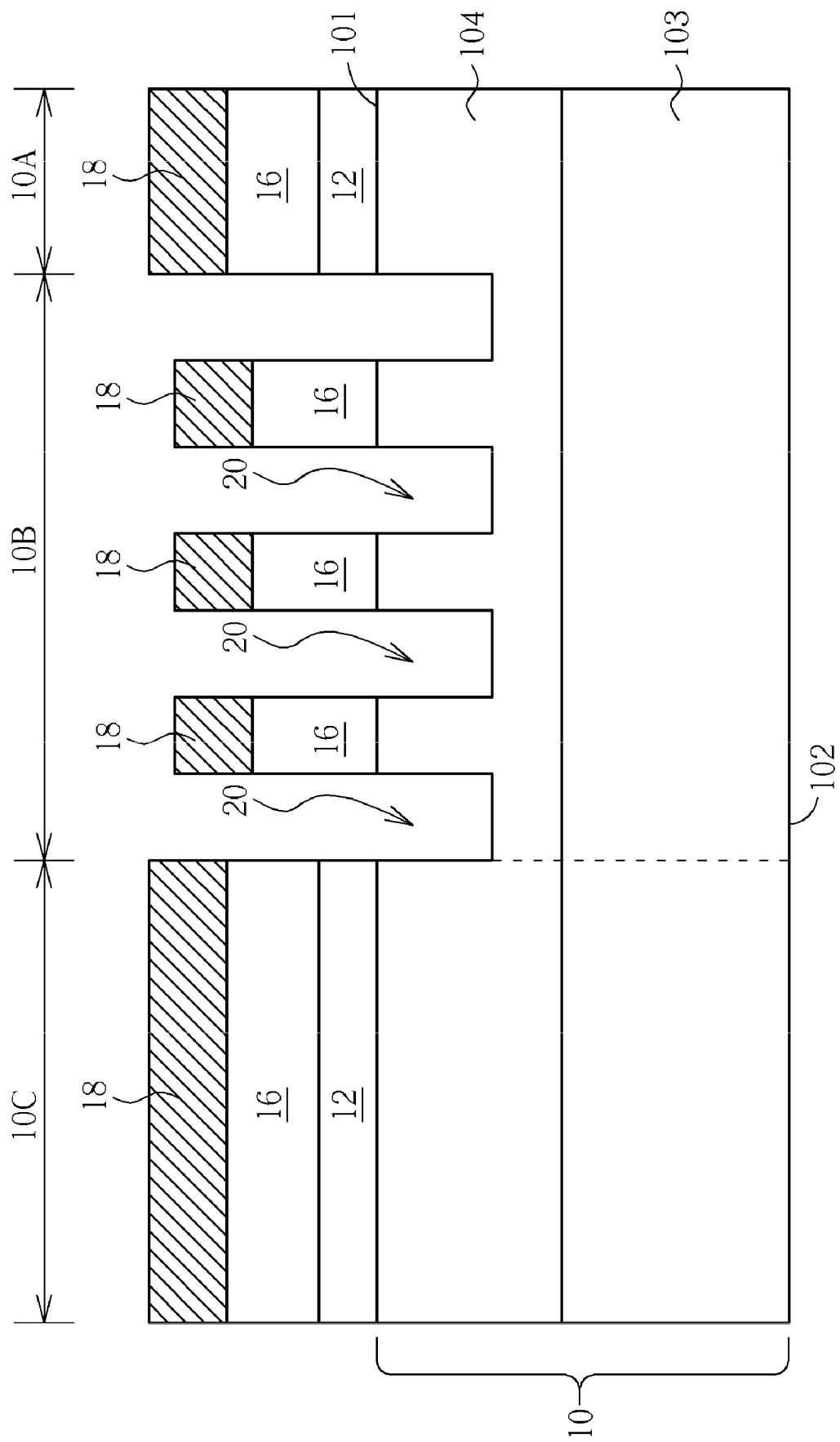
Figure 5:
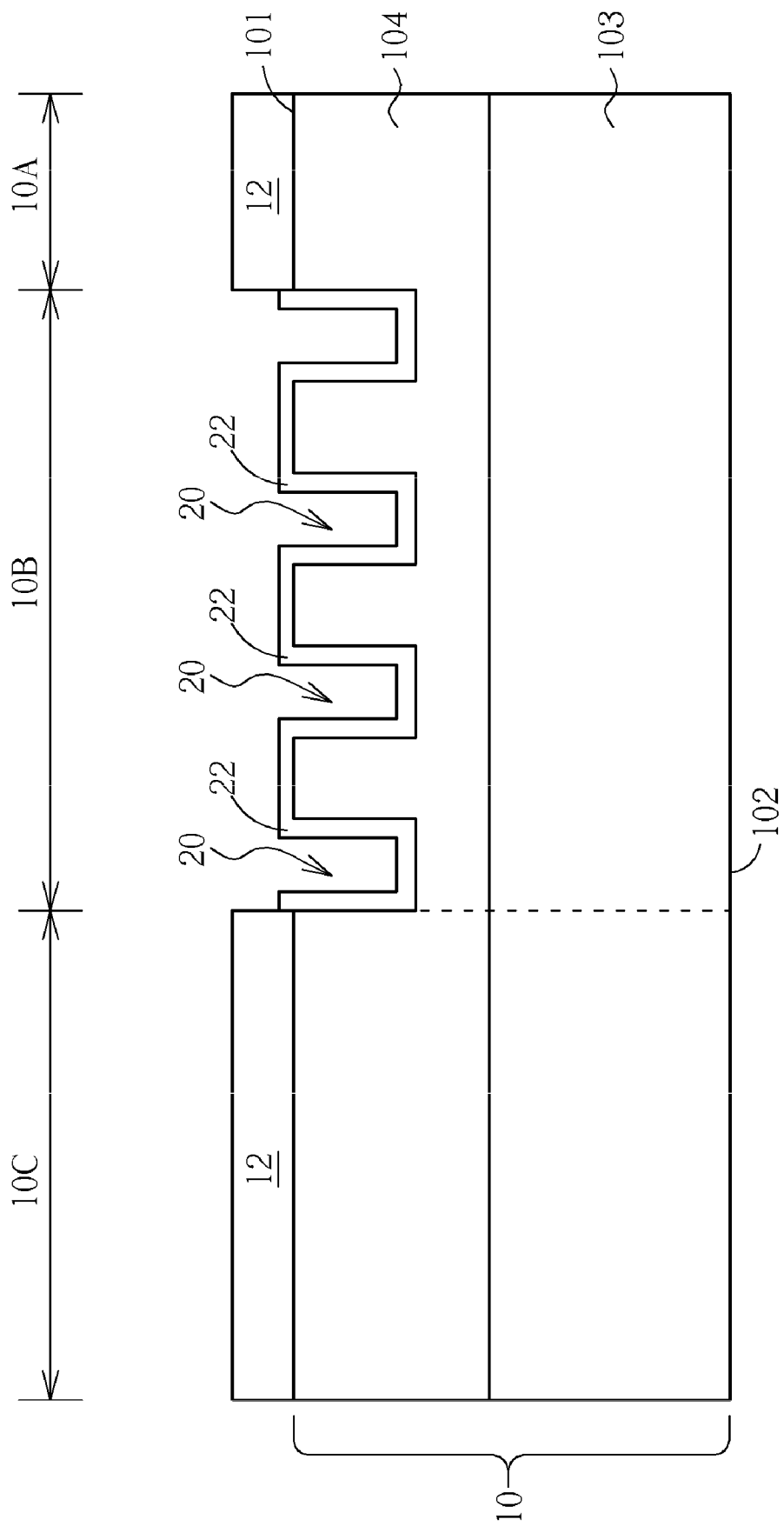
Figure 6:
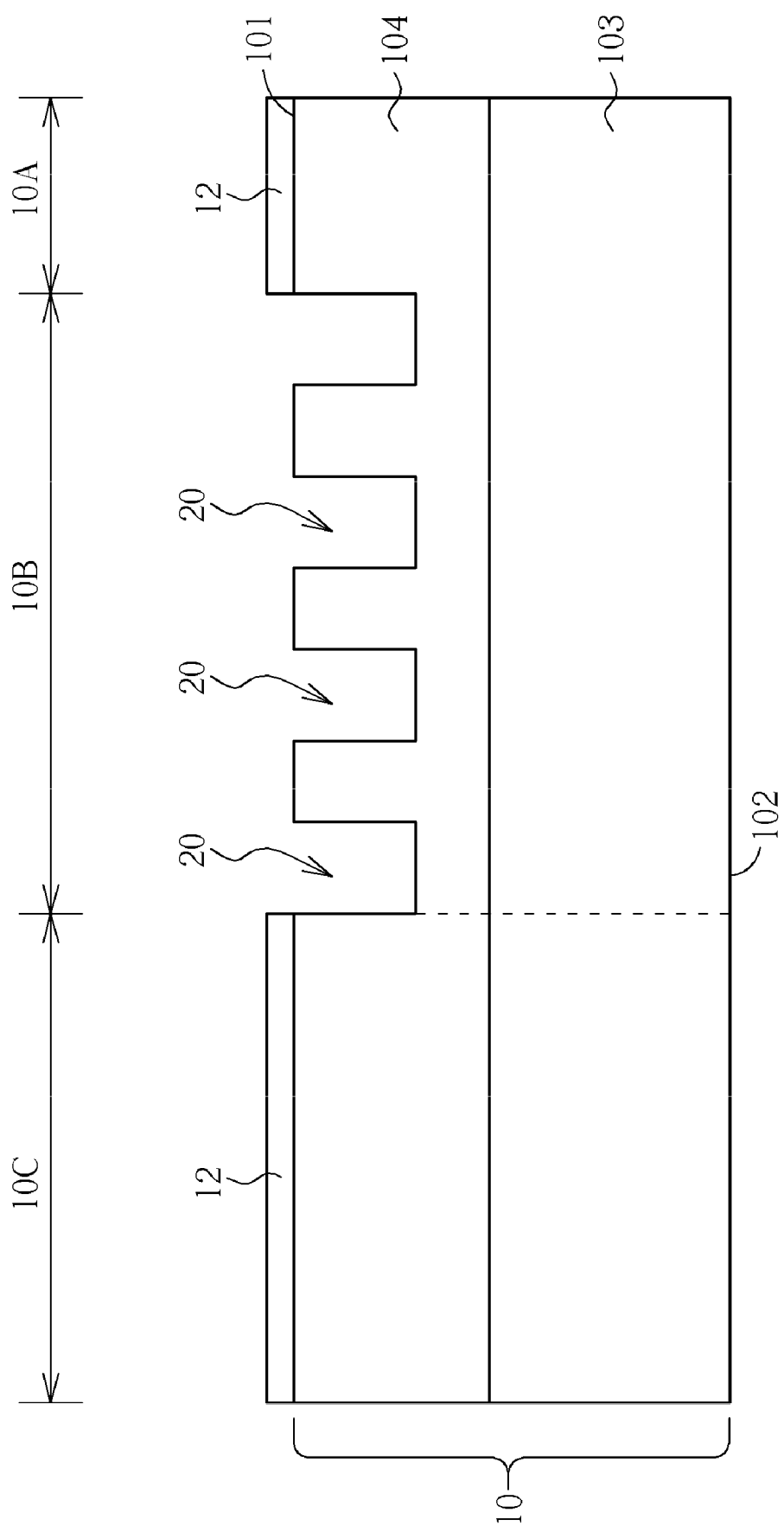

As shown in FIG. 3, the sacrificial layer 16 exposed by the patterned mask 18 is removed. As shown in FIG. 4, an etching process is performed to etch the semiconductor substrate 10 exposed by the patterned mask 18 and the sacrificial layer 16 in the trench MOS transistor device region 10B to form a plurality of trenches 20 in the trench MOS transistor device region 10B of the semiconductor substrate 10. As shown in FIG. 5, the patterned mask 18 and the sacrificial layer 16 are removed. A sacrificial oxidation layer 22 is optionally formed in an inner wall of each of the trenches by means of a thermal oxidation process. As shown in FIG. 6, the sacrificial oxidation layer 22 is removed.

Figure 7:
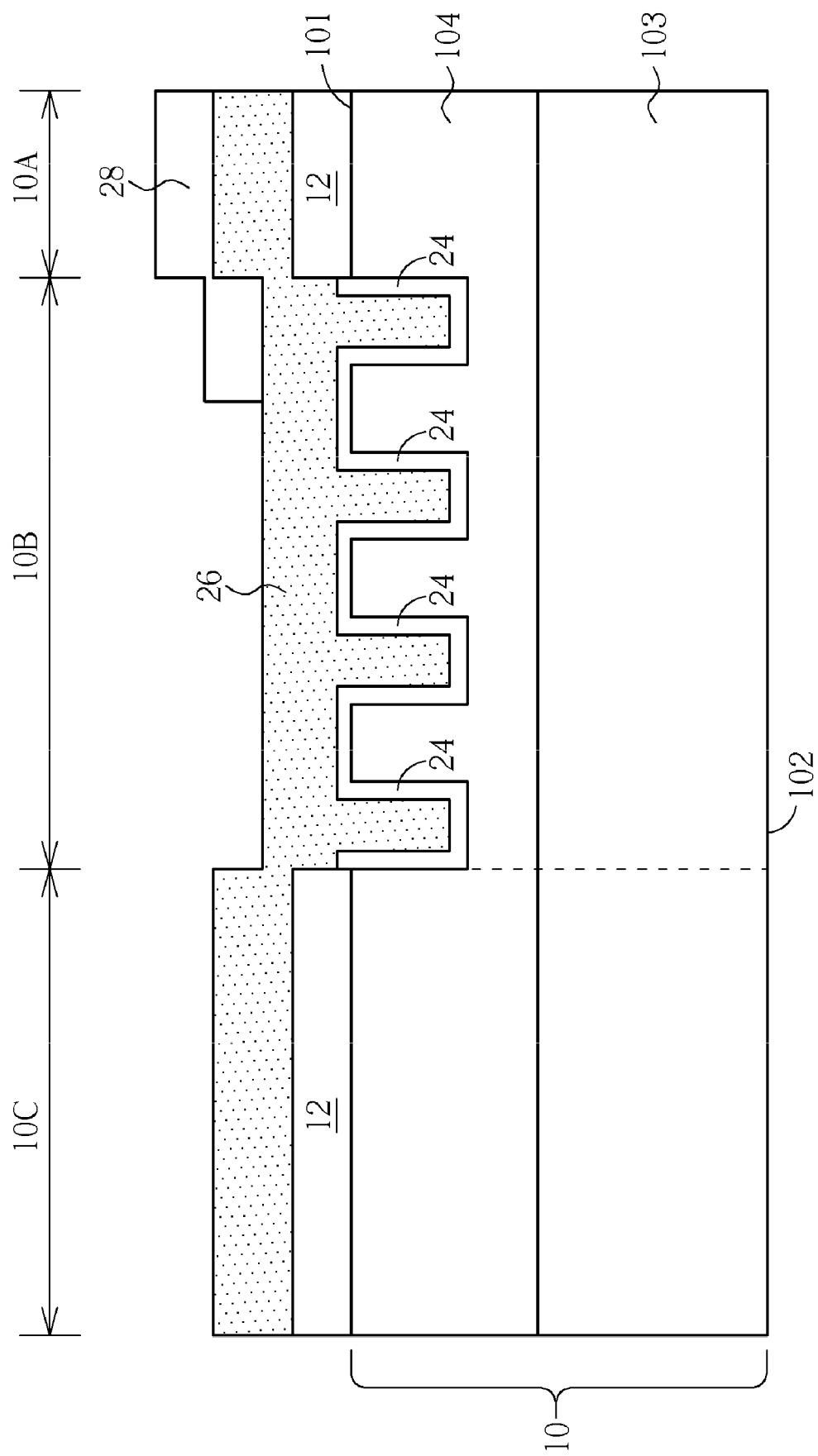

As shown in FIG. 7, a dielectric thin film 24 is formed on the top surface 101 of the semiconductor substrate 10 and the inner walls of the trenches 20. The dielectric thin film 24 acts as the gate electrode of the trench MOS transistor device, and the material of the dielectric thin film 24 may include a silicon oxide thin film or other dielectric materials. A doped semiconductor layer 26 is formed on the insulating layer 12 and the dielectric thin film 24. The trenches 20 are filled with the doped semiconductor layer 26. A patterned mask 28, such as a patterned photoresist, is formed by means of using a third mask together with a lithography process. The embedded SBD device region 10C and a portion of the doped semiconductor layer 26 disposed in the trench MOS transistor device region 10B are exposed by the patterned mask 28.

Figure 8:
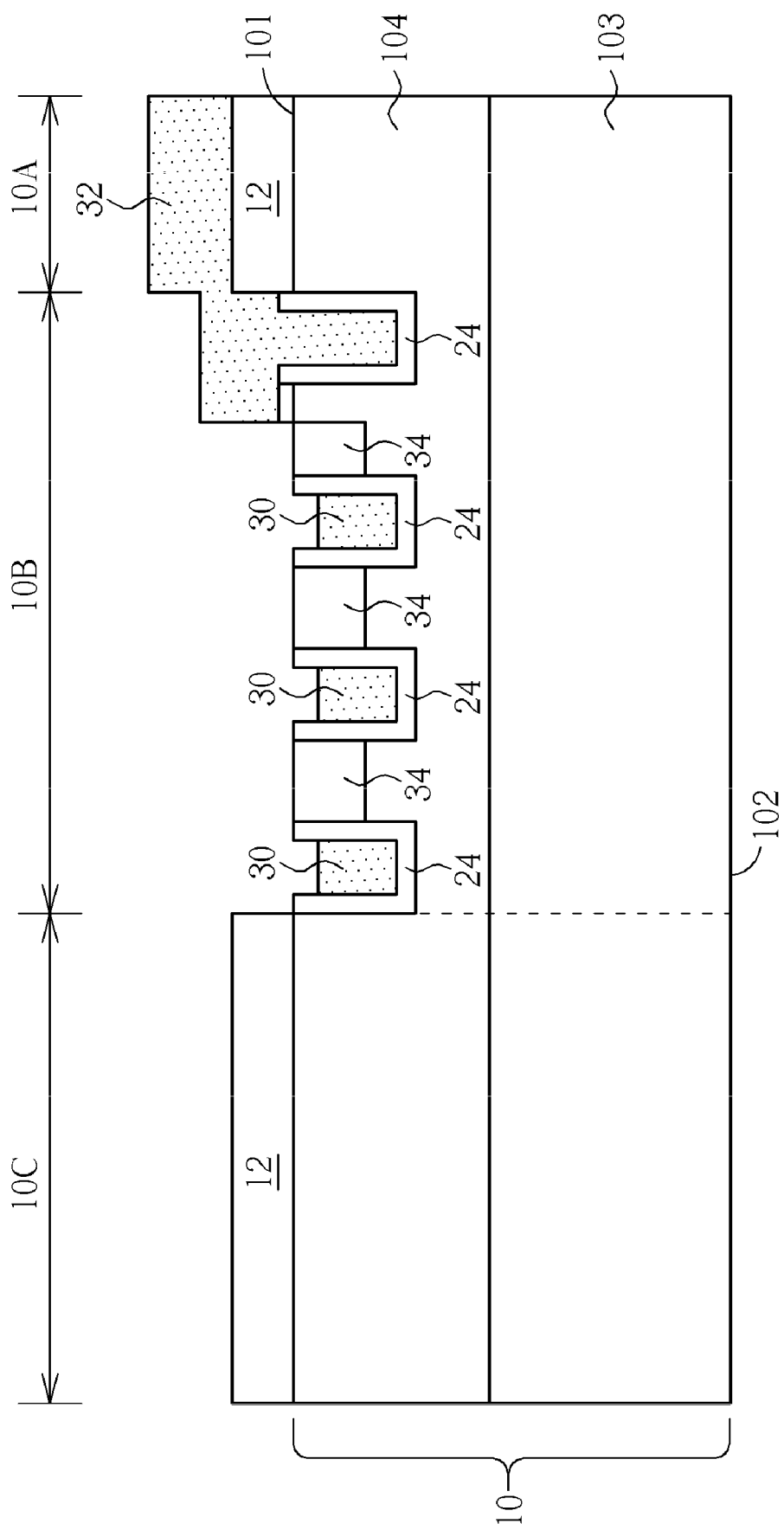

As shown in FIG. 8, the doped semiconductor layer 26 exposed by the patterned mask 28 is etched to form a gate electrode 30 in each of the trenches 20 and a gate linking line 32 in the gate electrode conducting region 10A. The gate linking line 32 is electrically connected to the gate electrodes 30. In the present embodiment, the material of the doped semiconductor layer 26 is polysilicon and is not limited to it. Other suitable materials having similar properties as the polysilicon are allowable. A doping process is performed to form at least a doped body 34 disposed in the trench MOS transistor device region 10B of the semiconductor substrate 10 out of the trenches 20. The doped bodies 34 have a second dopant type, such as P type. After that, the patterned mask 28 is removed.

Figure 9:
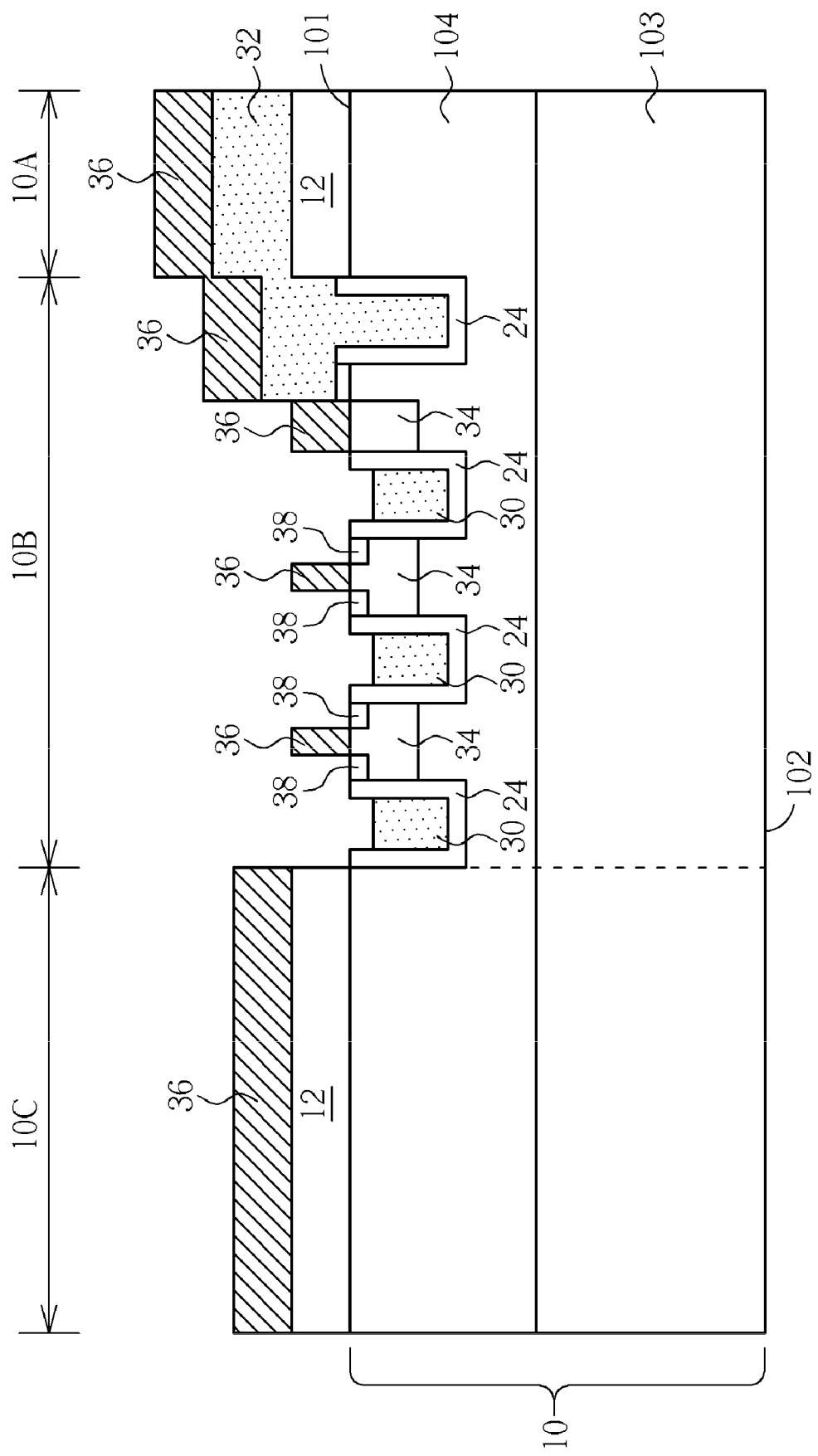

As shown in FIG. 9, a patterned mask 36, such as a patterned photoresist, is formed on the doped bodies 34 by means of using a fourth mask together with a lithography process. The gate linking line 32 disposed on the gate electrode conducting region 10A and the insulating layer 12 disposed in the embedded SBD device region 10C are covered by the patterned mask 36. In addition, a portion of the doped bodies are exposed by the patterned mask 36. A doping process is performed upon the exposed doped bodies 34 to form two the source regions 38 having the first dopant type in each of the exposed doped bodies 34.

Figure 10:
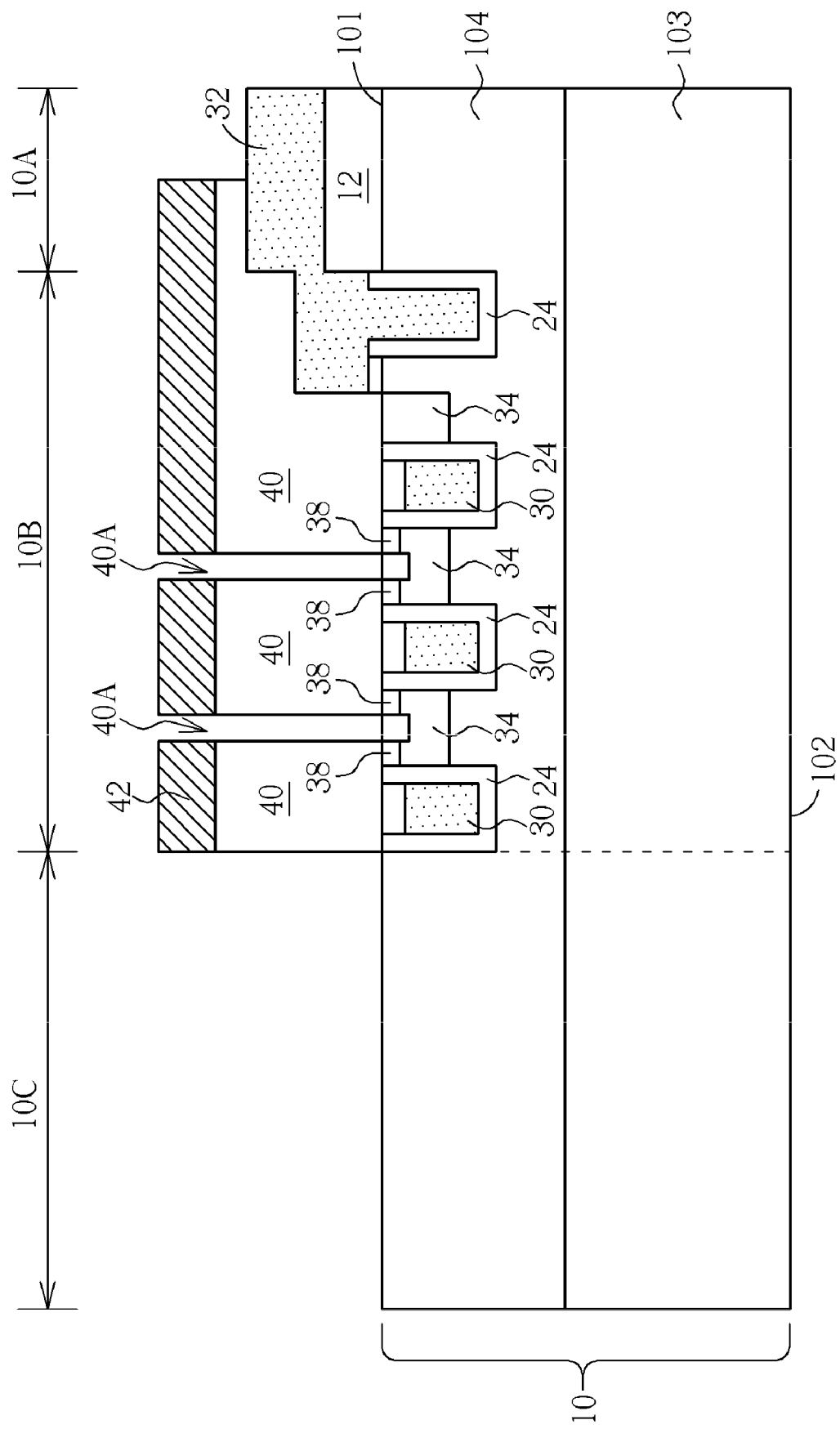

As shown in FIG. 10, the patterned mask 36 and the insulating layer 12 disposed in the embedded SBD device region 10C are removed. A dielectric layer 40 is formed on the semiconductor substrate 10 and the gate linking line 32. A patterned mask 42, such as a patterned photoresist, is formed on the dielectric layer 40 by means of using a fifth mask together with a lithography process. The dielectric layer 40 may be made of materials including borophosposilicate glass (BPSG) or other dielectric materials. The dielectric layer 40 exposed by the patterned mask 42 is etched to form at least a source opening 40A, which exposes a portion of the doped bodies 34.

Figure 11:
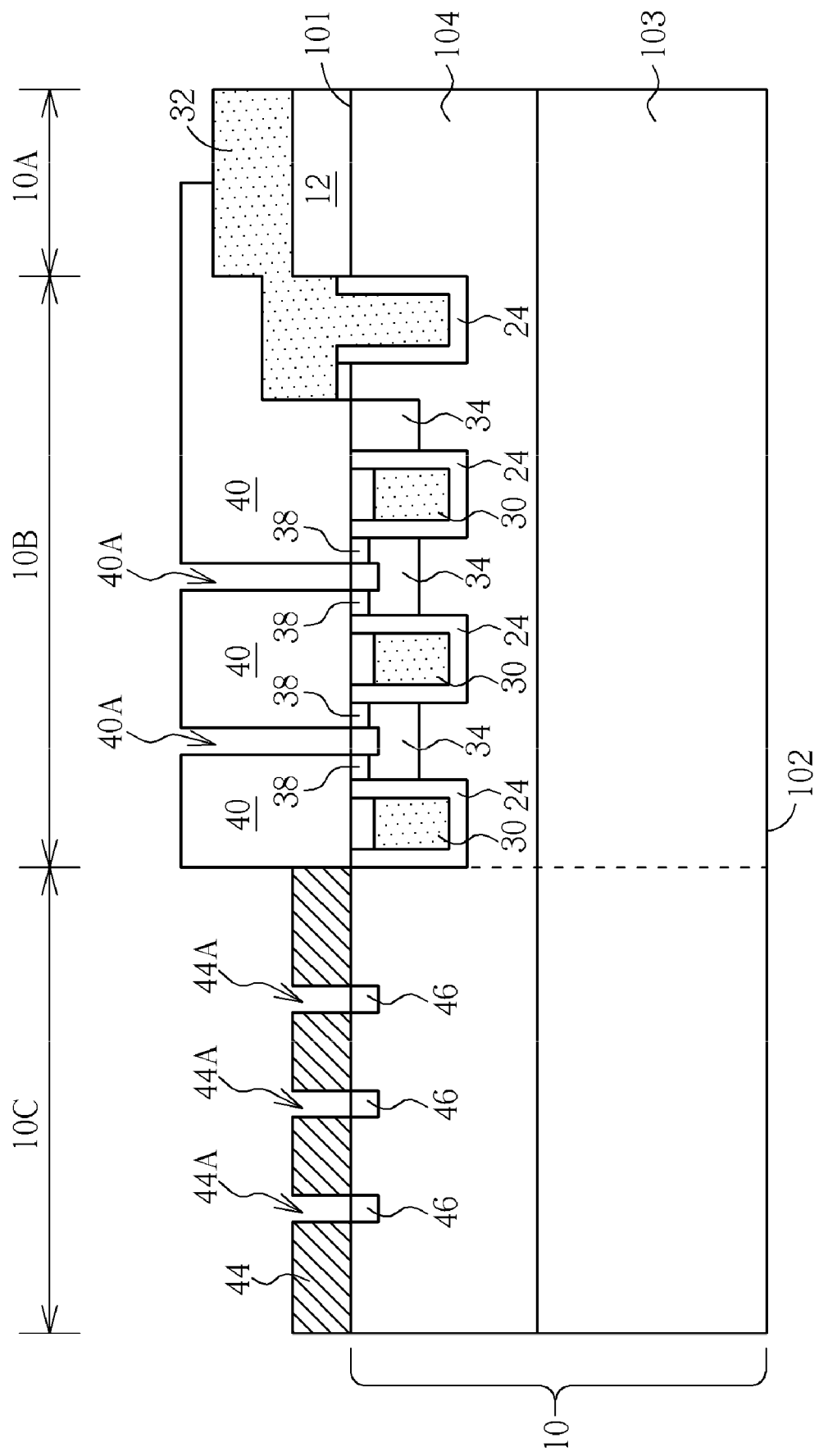

As shown in FIG. 11, the patterned mask 42 is removed. Another patterned mask 44, such as a patterned photoresist, is formed in the embedded SBD device region 10C of the semiconductor substrate 10 by means of using a sixth mask together with a lithography process. The patterned mask 44 includes at least an opening 44A to expose a portion of the embedded SBD device region 10C of the semiconductor substrate 10 in order to define the position and the size of the voltage bearing dopant region. An ion implantation process is performed on the semiconductor substrate 10 through the source openings 40A of the dielectric layer 40 and the openings 44A of the patterned mask 44 to form doped regions of second dopant type in the trench MOS transistor device region 10B and the embedded SBD device region 10C of the semiconductor substrate 10. The doped regions disposed in the embedded SBD device region 10C of the semiconductor substrate 10 are the voltage bearing dopant regions 46. The voltage bearing dopant regions 46 are used for improving the voltage ability of the SBD device which prevents the embedded SBD device region 10C of the semiconductor substrate 10 from direct voltage penetration. It's worth to be noted that the voltage ability of the SBD device may be modified by virtues of altering the dopant concentration, the doping energy, or the width of the voltage bearing dopant region 46. However, these factors also affect the properties of the SBD device. It is comprehensible to use appropriate dopant concentration, doping energy or width of the voltage bearing dopant region to achieve the most applicable voltage bearing ability and the property requirements of the SBD device. For example, the dopant concentration of the voltage bearing dopant region 46 of the present embodiment is of approximately between $10^{14}$ atoms/cm$^2$ and $10^{15}$ atoms/cm$^2$, the doping energy is of approximately between 30 KeV and 80 KeV, and the width of the voltage bearing dopant region is of approximately between 0.35 micrometers and 1.5 micrometers. In addition the value of these factors is not limited to the present embodiment and modification of these factors is allowable.

Figure 12:
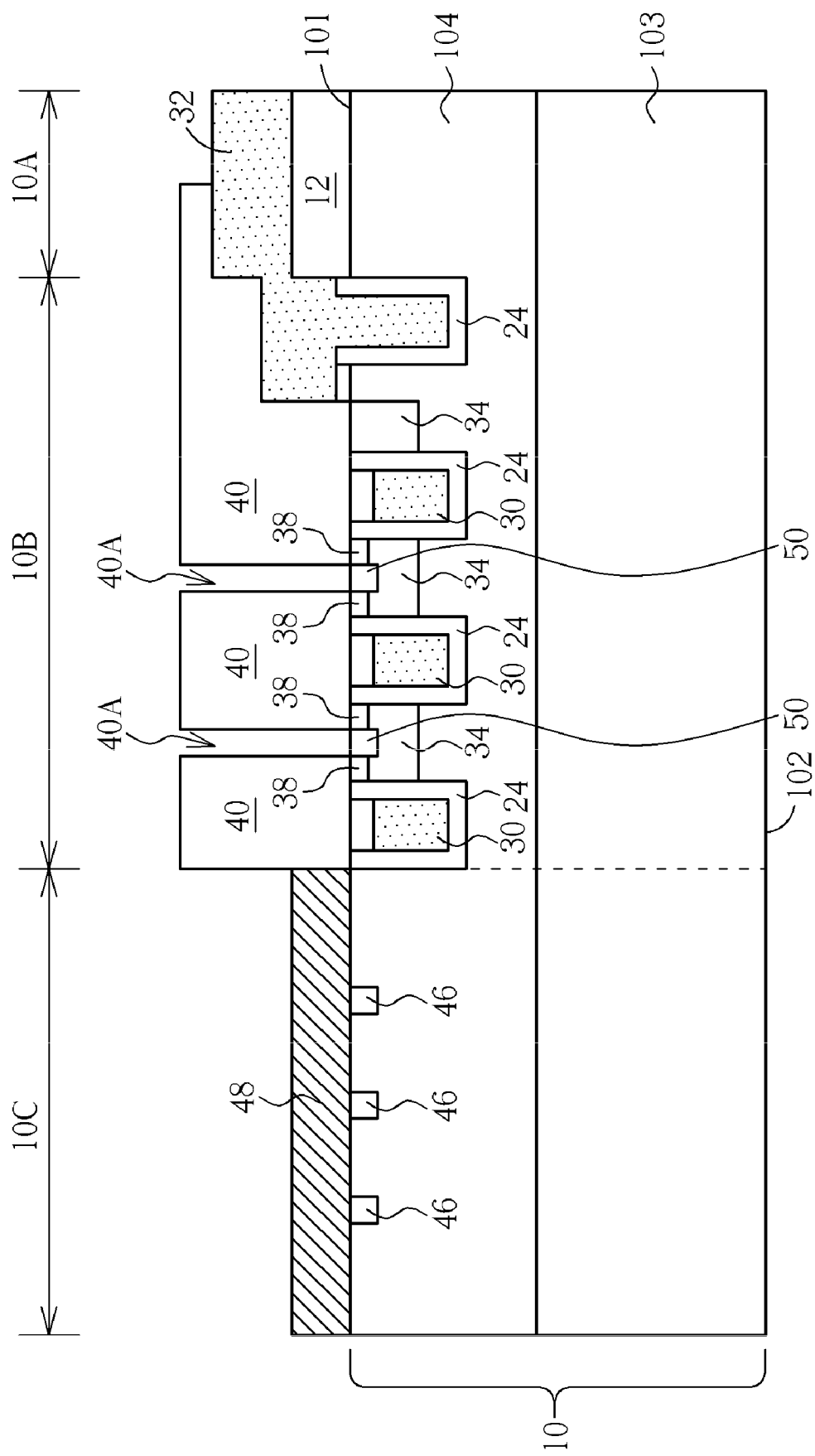

As shown in FIG. 12, the patterned mask 44 disposed in the embedded SBD device region 10C is removed. A mask 48 is formed on the embedded SBD device region 10C. Another ion implantation process is performed to introduce dopants into the semiconductor substrate 10 through the source opening 40A of the dielectric layer 40 in order to form at least a source contact 50 of the second dopant type in the trench MOS transistor device region 10B of the semiconductor substrate 10 between the source regions 38. In the present embodiment, the dopant concentration of the source regions 38 is greater than that of the source contacts 50, and is not limited to this condition. The voltage bearing dopant region 46 and the source contacts 50 are formed by distinct ion implantation process, and the dopant concentration of the source contacts 50 is greater than that of the voltage bearing dopant region 46. The dopant concentration of the voltage bearing dopant regions 46 may be increased or reduced depending on the requirements of the voltage bearing ability. The formation of the voltage bearing dopant regions 46 may be formed by the same ion implantation process for forming the source contacts 50.

Figure 13:
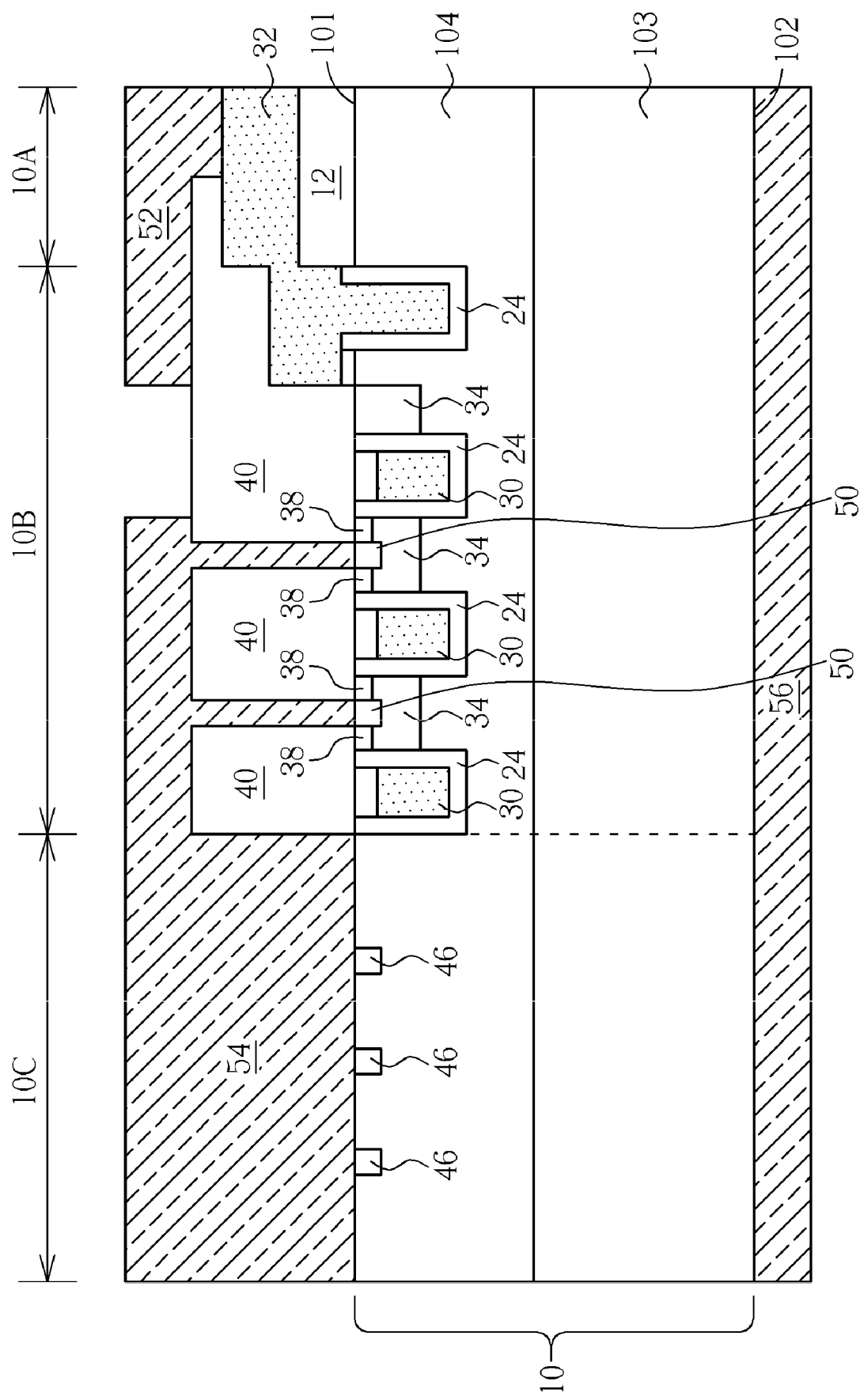

As shown in FIG. 13. the mask 48 disposed in the embedded SBD device region 10C is removed. A gate line 52 is formed on the gate electrode conducting region 10A and a source electrode 54 is formed on the trench MOS transistor device region 10B and the embedded SBD device region 10C. The gate line 52 is electrically connected to the gate linking line 32 disposed in the gate electrode conducting region 10A. The source electrode 54 is electrically connected to the source contacts 50 disposed in the trench MOS transistor device region 10B and the embedded SBD device region 10C of the semiconductor substrate 10. In addition, a drain electrode 56 is formed on the bottom surface 102 of the semiconductor substrate 10. It should be noted that the drain electrode 48 is formed on the bottom surface 102 of the semiconductor substrate 10, and the formation of the drain electrode 56 is not limited to be formed in this step. The formation of the drain electrode 56 may be performed in other steps; i.e. before or after the processes of forming the devices on the front surface of the semiconductor substrate 10.

As described above, the method of the present invention simultaneously forms the trench MOS transistor device and the embedded SBD device in the semiconductor substrate. The trench MOS transistor device may be a power MOS transistor device, but is not limited to it. The embedded SBD device is electrically connected to the source electrode and the drain electrode of the power MOS transistor device in parallel. The embedded SBD device has a low threshold voltage, i.e. between 0.3 to 0.5 volts, and therefore has a low forward voltage drop. In addition, the voltage bearing ability of the embedded SBD device may be modified by means of altering the dopant concentration or the width of the voltage bearing dopant region or the thickness of the epitaxial silicon layer 103 disposed in the embedded SBD device region 10C. No extra mask is required. In addition, the embedded SBD device saves the extra cost of purchasing the external SBD device.

Figure 14:
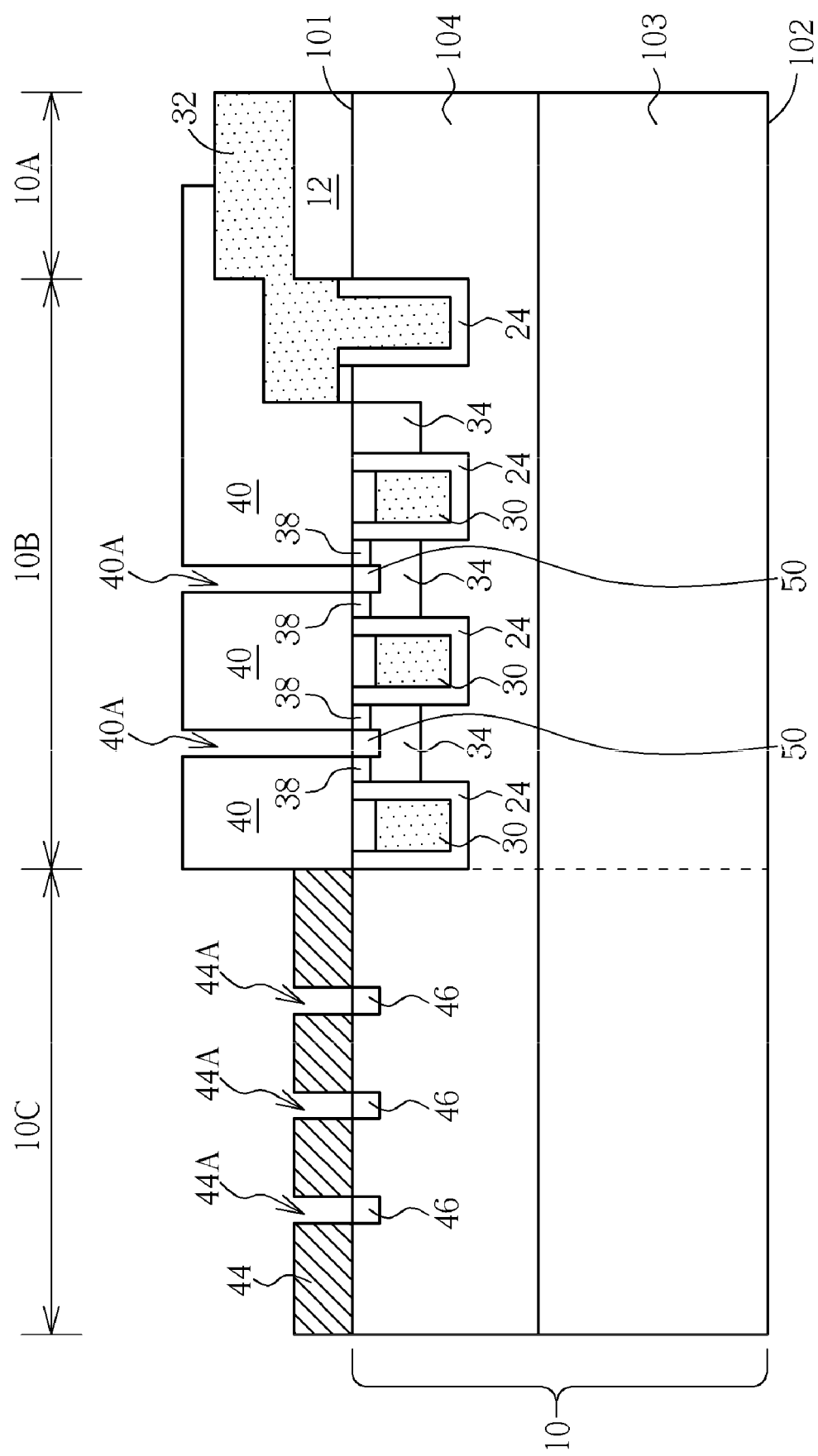
FIG. 14 is a schematic diagram showing a method of forming semiconductor device according to another preferred embodiment of the present invention.

Please refer to FIG. 14. FIG. 14 is a schematic diagram showing a method of forming semiconductor device according to another preferred embodiment of the present invention. The difference between the present embodiment and the above-mentioned embodiment is the steps of forming the voltage bearing dopant region and the source contact. The same manufacturing processes used in both preferred embodiments are illustrated in FIGS. 1-10 and FIG. 13. As shown in FIG. 14, a dielectric layer 40 is formed on the trench MOS transistor device region 10B of the semiconductor substrate 10, and at least a source opening 40A is formed in the dielectric layer 40 to expose a portion of the doped bodies 34. Furthermore, a patterned mask 44 is formed on the embedded SBD device region 10C of the semiconductor substrate 10, and the patterned mask 44 has at least an opening 44A to expose a portion of the semiconductor substrate 10 disposed in the embedded SBD device region 10C. An ion implantation process is performed to introduce dopants into the semiconductor substrate 10 through the source openings 40A of the dielectric layer 40 and the openings 44A of the patterned mask 44, so that at least a source contact 50 is formed in the doped bodies 34 in the trench MOS transistor device region 10B and at least a voltage bearing dopant region 46 is formed in the embedded SBD device region 10C of the semiconductor substrate 10. Under a circumstance of providing a particular voltage bearing ability and a specific property of the SBD device, the voltage bearing dopant regions 46 may have equal dopant concentration as the source contacts 50. It is therefore to form the voltage bearing dopant regions 46 and the source contacts 50 by virtues of the same ion implantation process that saves the use of one mask and reduces production costs.

As described above, the method of forming a semiconductor substrate of the present invention is performed to simultaneously form the trench MOS transistor and the embedded SBD device in the semiconductor substrate. The embedded SBD device has low forward voltage drop which reduces power dissipation. In addition, the voltage bearing ability of the embedded SBD device may be modified by means of altering the dopant concentration or the width of the voltage bearing dopant region or the thickness of the epitaxial silicon layer 103 disposed in the embedded SBD device region 10C. No extra mask is required. In addition, the formation of the embedded SBD device saves the extra cost of purchasing the external SBD device.

Those skilled in the art will readily observe that numerous modifications and alterations of the device and method may be made while retaining the teachings of the invention.

What is claimed is:

1. A method of forming a semiconductor device, comprising:

providing a semiconductor substrate, the semiconductor substrate comprising a gate electrode conducting region, a trench MOS transistor device region, and an embedded SBD device region defined thereon, and the semiconductor substrate having a first dopant type;

forming an insulating layer on a top surface of the gate electrode conducting region of the semiconductor substrate;

forming at least a trench in the trench MOS transistor device region of the semiconductor substrate;

forming at dielectric thin film on the top surface of the semiconductor substrate and an inner wall of the trench;

forming a doped semiconductor layer on the insulating layer and the dielectric thin film, and filling the doped semiconductor layer in the trench;

removing a portion of the doped semiconductor layer and forming a gate electrode in the trench and a gate linking line in the gate electrode conducting region, the gate linking line being electrically connected to the gate electrode;

performing a doping process upon the embedded SBD device region of the semiconductor substrate out of the trench to form at least a doped body in the embedded SBD device region, the doped body having a second dopant type;

forming a patterned mask on the doped body, the patterned mask covering a portion of the doped body, and performing a doping process upon the exposed doped body to form two source regions in the doped body, the source regions having the first dopant type;

removing the patterned mask;

forming a dielectric layer on the semiconductor substrate, the dielectric layer having at least a source opening to expose the doped body between the source regions;

forming a source contact in the doped body in the trench MOS transistor device region between the source regions and forming a voltage bearing dopant region in the embedded SBD device region of the semiconductor substrate, the source contact and the voltage bearing dopant region having the second dopant type; and forming a gate line in the gate electrode conducting region and forming a source electrode in the trench MOS transistor device region and the embedded SBD device region, the gate line being electrically connected to the gate linking line disposed in the gate electrode conducting region, the source electrode being electrically connected to the source contact disposed in the trench MOS transistor device region and the embedded SBD device region of the semiconductor substrate.

2. The method of claim 1, wherein the step of forming the source contact in the doped body in the trench MOS transistor device region between the source regions and forming a voltage bearing dopant region in the embedded SBD device region of the semiconductor substrate further comprises steps of:

forming a patterned mask in the embedded SBD device region, the patterned mask having at least an opening to expose a portion of the semiconductor substrate;

performing a doping process to introduce dopants into the semiconductor substrate through the opening of the dielectric layer and the opening of the patterned mask; and removing the patterned mask.

3. The method of claim 1, further comprising a step of forming a drain electrode on a bottom surface of the semiconductor substrate.

4. The method of claim 1, wherein the semiconductor substrate comprises a silicon substrate and an epitaxial silicon layer disposed on the silicon substrate.

5. The method of claim 1, wherein the silicon substrate has a greater dopant concentration than that of the epitaxial silicon layer.

6. The method of claim 1, wherein the source regions have a greater dopant concentration than that of the source contact, and the dopant concentration of the source contact is greater than that of the doped body.

7. The method of claim 1, further comprising steps of forming a sacrificial oxidation layer on the inner wall of the trench and removing the sacrificial layer before the formation of the dielectric thin film disposed on the top surface of the semiconductor substrate and the inner wall of the trench.

8. The method of claim 1, wherein the step of forming the source contact in the doped body in the trench MOS transistor device region between the source regions and forming a voltage bearing dopant region in the embedded SBD device region of the semiconductor substrate further comprises steps of:

forming a patterned mask on the embedded SBD device region, the patterned mask has an opening to expose a portion of the semiconductor substrate;

performing a doping process to introduce dopants into the semiconductor substrate through the opening of the dielectric layer and the opening of the patterned mask to form the voltage bearing dopant region in the embedded SBD device region of the semiconductor substrate; and removing the patterned mask disposed on the embedded SBD device region, forming a mask in the embedded SBD device region, and performing another doping process to introduce dopants into the semiconductor substrate through the opening of the dielectric layer to form the source contact in the trench MOS transistor device region of the semiconductor substrate.

* * * * *